United States Patent [19]

Miller et al.

[11] Patent Number: 4,885,720

[45] Date of Patent: Dec. 5, 1989

[54] MEMORY DEVICE AND METHOD IMPLEMENTING WORDLINE REDUNDANCY WITHOUT AN ACCESS TIME PENALTY

[75] Inventors: Christopher P. Miller, Jericho; Charles S. Patton, Shelburne, both of Vt.

[73] Assignee: International Business Machines Corporation, Armonk, N.Y.

[21] Appl. No.: 176,473

[22] Filed: Apr. 1, 1988

[51] Int. Cl.$^4$ .............................................. G11C 29/00
[52] U.S. Cl. ............................... 365/200; 365/230.06
[58] Field of Search ............... 365/200, 230, 189, 233

[56] References Cited

U.S. PATENT DOCUMENTS

| | | | |
|---|---|---|---|
| 3,753,244 | 8/1973 | Sumilas | 364/200 |
| 4,365,319 | 12/1982 | Takemae | 365/200 |
| 4,441,170 | 4/1984 | Folmsbee et al. | 365/200 |
| 4,928,068 | 1/1984 | Baba | 365/200 |

OTHER PUBLICATIONS

Fitzgerald et al., "Memory System with High Performance Word Redundancy", IBM Technical Disclosure Bulletin, vol. 19, No. 5, Oct. 1976, pp. 1638-1639.
Smith et al., "Laser Programmable Redundancy and Yield Improvement in a 64K DRAM", IEEE Journal of Solid-State Circuits, vol. SC-16, No. 5 Oct. 1981.
Benevit et al., "A 256K Dynamic Random Access Memory", IEEE Journal of Solid-State Circuits, vol. SC-17, No. 5, Oct. 1982, pp. 857-861.
Fitzgerald et al., IBM Journal of Research Development, vol. 24, no. 3, May 1980, pp. 291-297, "Circuit Implemntation of Fusible Redindant Addresses . . . ".
Cenker et al., "A Fault Tolerant 64K DRAM", IEEE Transactions on Electrical Devices Col ED-26, No. 6, Jun. 1979, pp. 853-860.

Primary Examiner—Glenn A. Gossage
Attorney, Agent, or Firm—Sughrue, Mion, Zinn, Macpeak & Seas

[57] ABSTRACT

A redundant word decoder compares an incoming address signal with a list of defective addresses and, in response to the comparison, produces at least one comparison signal to control the propagation of a redundany driver signal along at least one redundant wordline. A main trigger receives the comparison signal and, in response thereto, controls a triggering of a main wordline driver to produce a main driver signal. The main wordline driver and the redundant word decoder are responsive to opposite states of the comparison signal, such that, for a given comparison signal, only one of the main driver signal and redundant driver signal is applied to a memory array.

17 Claims, 4 Drawing Sheets

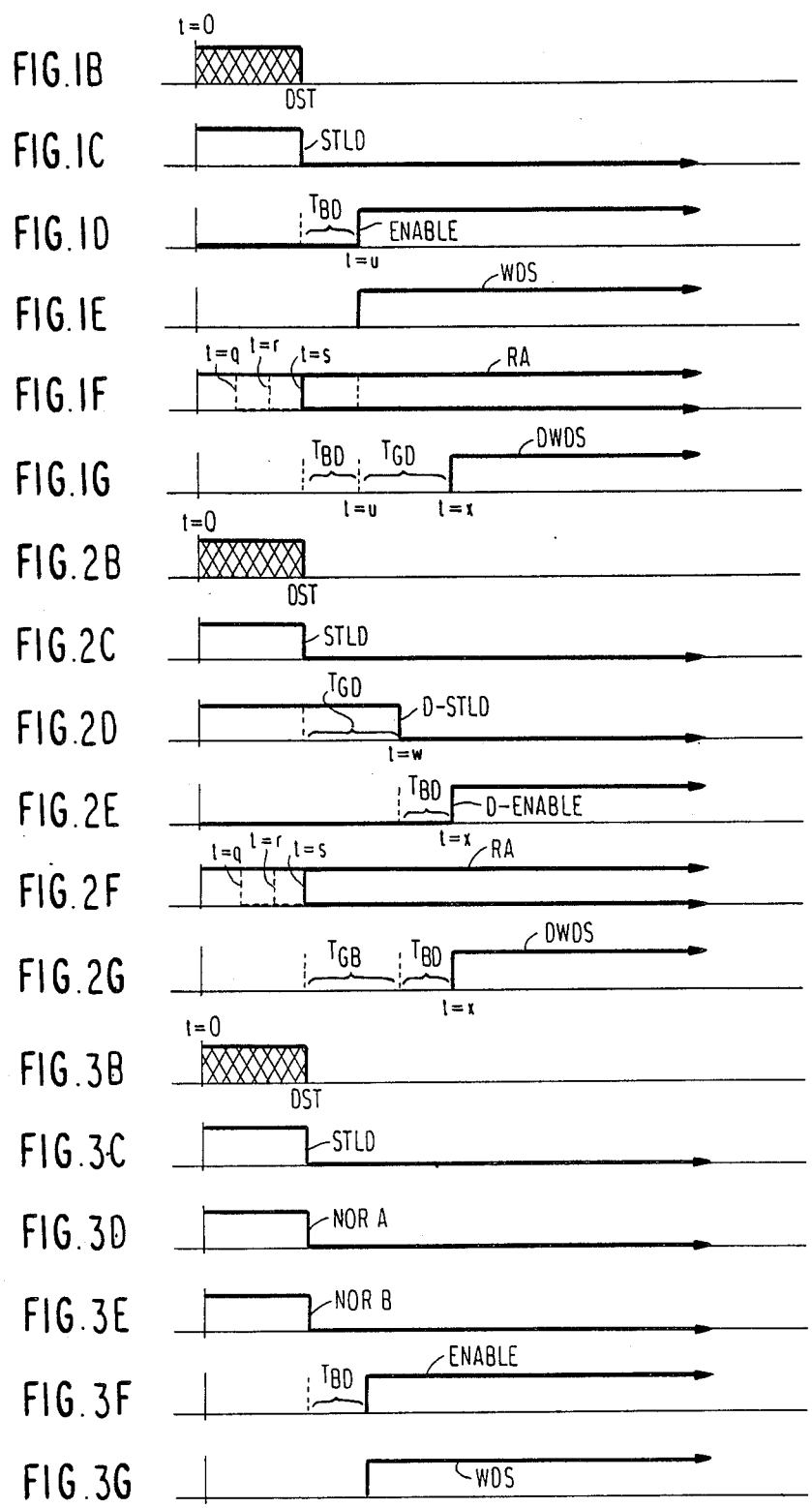

MEMORY DEVICE AND METHOD IMPLEMENTING WORDLINE REDUNDANCY WITHOUT AN ACCESS TIME PENALTY

BACKGROUND OF THE INVENTION

1. Technical Field

The present invention relates to a memory device and method implementing wordline redundancy without an access time penalty.

2. Prior Art

The application of wordline redundancy to enhance the yield for memory arrays is an accepted fact throughout the semiconductor industry. To be attractive, wordline redundancy should occur without major impact to chip performance (e.g. access time), power requirements or size. Numerous approaches have been proposed with varying degrees of success; for example:

U.S. Pat. No. 4,365,319, issued to Takemae on Dec. 21, 1982, implements redundancy by utilizing two kinds of decoders and drivers, i.e., a PROM decoder for determining whether an incoming address is a defective address, a redundancy driver for driving a redundancy array, and row address decoders and drivers for driving a main memory cell matrix. A first embodiment of the Takemae teachings (FIG. 1) is disadvantageous in that the switch 7 results in an access time penalty, and results in a semiconductor space penalty because the switch must be large to handle high currents. In a second embodiment (FIGS. 2–4), multiple AND gates $D_0$–$D_{63}$ replace the large switch 7 (FIG. however, this is not much of an improvement because the memory device still suffers from both an access time (i.e., an AND-gate) penalty, and also a semiconductor space penalty as the collective area of the AND gates $D_0$–$D_{63}$ is still large. A third embodiment (FIGS. 5–10) suffers an access time penalty due to AND-gate delays introduced by the incorporation of AND gates $D_{91}$–$D_{94}$ (FIG. 6) and AND gates $D_0$–$D_3$ (FIG. 8A) to control the activation of the decoders and drivers 9 and 10, respectively.

U.S. Pat. No. 3,753,244, issued to Sumilas et al on Aug. 14, 1973 implements redundancy by placing an extra line of memory cells on a memory chip together with a defective address store and a comparator circuit for disabling a defective line of cells and replacing it with the extra line of cells.

The Intel 2164A 64K DRAM represents a memory device where access time is the same whether it is the normal wordlines or the redundancy wordlines which are being used; however, this product is always affected by an access time penalty, whether repaired with wordline redundancy or not, because chip timing is set up to allow for redundancy repairs. More specifically, chip performance is slowed dee to the need to deselect a faulty wordline's word decoder after the redundant word decoders sense a match with an incoming address. Once the match is sensed, a deselect generator is fired, triggered or selected to deselect the entire row of normal word decoders. After the faulty wordline word decoder is deselected, then the wordline drive is enabled. Further discussions concerning the 2164A can be seen in the Intel Application Description AP-131, pp. 14–16, and "An Analysis of the i2164A", Mosaid Incorporated, p. 5, 41–52, April 1982. In addition, it should be further noted that IBM has a 72k DRAM which utilizes a similar approach.

The Bell Lab 64K DRAM (described by R. T. Smith, J .D. Chlipala, J. F. M. Bindels, R. G. Nelson, F. H. Fischer and T. F. Mantz, in "Laser Programmable Redundancy and Yield Improvement in a 64K DRAM", *IEEE Journal of Solid-State Circuits*, Vol, SC-16, No. 5, pp. 506–514, October 1981), and the 256K DRAM (described by C .A. Benevit, J. M. Cassard, K. J. Dimmler, A. C. Dumbri, M. G. Mound, F. J. Procyk, W. R. Rosenzweig and A. W. Yanof, in "A 256k Dynamic Random Access Memory", *IEEE Journal of Solid-State Circuits*, Vol. SC-17, No. 5, pp. 857–861, October 1982), implement wordline redundancy without an access time impact by using laser-fused redundancy on the wordline pitch. No access time penalty is incurred because the defective wordline is permanently disconnected by exploding a programmable link in the wordline. This method of redundancy is disadvantageous because the tighter design rules of present and future high density memory products are causing a shrinkage in the wordline pitch. The result is a requirement for a laser spot size and laser beam position accuracy beyond what is available from laser programming systems today. Thus, laser-fused redundancy is disadvantageous in that the current level of laser technology requires an off wordline pitch method or an increase in memory chip size due to the need for an increased wordline pitch.

The IBM 32K DRAM (described by B. F. Fitzgerald and E. P. Thoma, in "Circuit Implementation of Fusible Redundant Addresses on RAMs for Productivity Enhancement", *IBM Journal of Research and Development*, Vol. 24, No. 3, pp. 291–295, May 1980) implements wordline redundancy without an access time penalty by adding separate sense amplifier columns for the redundant wordlines. No access penalty is incurred because the redundant wordline and the defective wordline operate in parallel, and the selection of the redundant, versus the normal sense amplifiers, occurs during the sensing operation. This approach is disadvantageous in that chip size is significantly increased due to the need for additional latches for each bitline along the redundant wordline.

Similarly, R. P. Cenker, D. G. Clemons, W. R. Huber, J. B. Petrizzi, F. J. Procyk and G. M. Trout, in "A Fault-Tolerant 64K Dynamic Random Access Memory", *IEEE Transactions on Electron Devices*, Vol. ED-26, No. 6, June 1979, pp. 853–860, teach a word redundancy technique having no access time penalty, but requiring that disabling fuses be placed within each redundant and non-redundant decoder, thus significantly increasing the required chip area.

B. F. Fitzgerald and D. W. Kemerer, in "Memory System With High-Performance Word Redundancy", *IBM Technical Disclosure Bulletin*, Vol. 19, No. 5, October 1976, pp. 1638–1639, describe an implementation of word redundancy with no access penalty by accessing both a normal and redundant row in independent arrays. Selection of good data was made at the data out buffers.

While the above approaches represent important advances in semiconductor manufacturing technology, there still exists a need for a memory device and approach which are able to provide wordline redundancy without the disadvantages cited above, i.e., without any access time penalty, and without any significant impact on chip size and power requirements.

SUMMARY OF THE INVENTION

The present invention provides both a memory device and a method embodying a unique approach for satisfying the aforementioned needs.

More particularly, the present invention provides a semiconductor memory device and method for implementing wordline redundancy with no access penalty. A redundant word decoder compares an incoming address signal with a programmed defective address, and in response to the comparison produces at least one comparison signal to control the propagation of a redundant driver signal along at least one redundant wordline. A main trigger means receives the comparison signal and in response thereto, controls a firing or triggering of a main wordline driver. The main wordline driver and the redundant word decoder are responsive to opposite states of the comparison signal, such that, for a given comparison signal, only one of the main driver signal and redundant driver signal is applied to a memory array.

It is therefore an important object of the present invention to provide a memory device and method which provide wordline redundancy without an access time penalty.

A second object of the invention is to provide a memory device and method which provide wordline redundancy without a significant impact on memory chip size.

A third object is to provide a memory device and method which provide wordline redundancy without a significant impact on memory chip power requirements.

It is another object of the present invention to provide a memory device and method which provide wordline redundancy with a simple, but novel, timing circuit arrangement.

Still another object of the present invention is to provide a memory device and method which provide a wordline redundancy operation with a minimum number of timing signal transitions.

These and other objects and advantages of the invention will become more fully apparent from the following detailed description of the preferred embodiment, in conjunction with the accompanying drawings, wherein:

BRIEF DESCRIPTION OF THE DRAWINGS

FIG. 1A and FIGS. 1B-1G are simplified circuit and timing diagrams which illustrate a first memory device embodying a disadvantageous redundancy approach.

FIG. 2A and FIGS. 2B-2G are simplified circuit and timing diagrams which illustrate a second memory device having a disadvantageous redundancy approach.

FIG. 3A and FIGS. 3B-3G are simplified circuit and timing diagrams which illustrate a preferred embodiment of the invention in the form of a memory device having an advantageous redundancy approach.

DETAILED DESCRIPTION OF THE PREFERRED EMBODIMENT OF THE INVENTION

First, an important point regarding the drawings should be pointed out. Several timing diagrams are utilized to illustrate the important advantage of the present invention. In the timing diagrams, there are often shown signals being input to circuit components, and output signals being produced in response thereto. Often the output signal from a device is illustrated as being produced instantaneously with the input of a signal to the device. The inherent time delay of these devices has been ignored and omitted from the drawings in an effort to simplify the drawings and thus highlight the important time saving feature of the present invention.

FIGS. 1A and 1B-1G are simplified circuit and timing diagrams, respectively, of a memory device and are used to illustrate a disadvantageous redundancy approach. The memory device includes memory structure 99 which is divided into a main memory array 100 and a redundant memory array 102. Although not shown, it should be understood that the memory wordlines (described below) of the memory structure would be connected to further support circuitries which sense, amplify and output memory values stored in individual memory cells (not shown) of the memory structure 99.

Figure 1A:
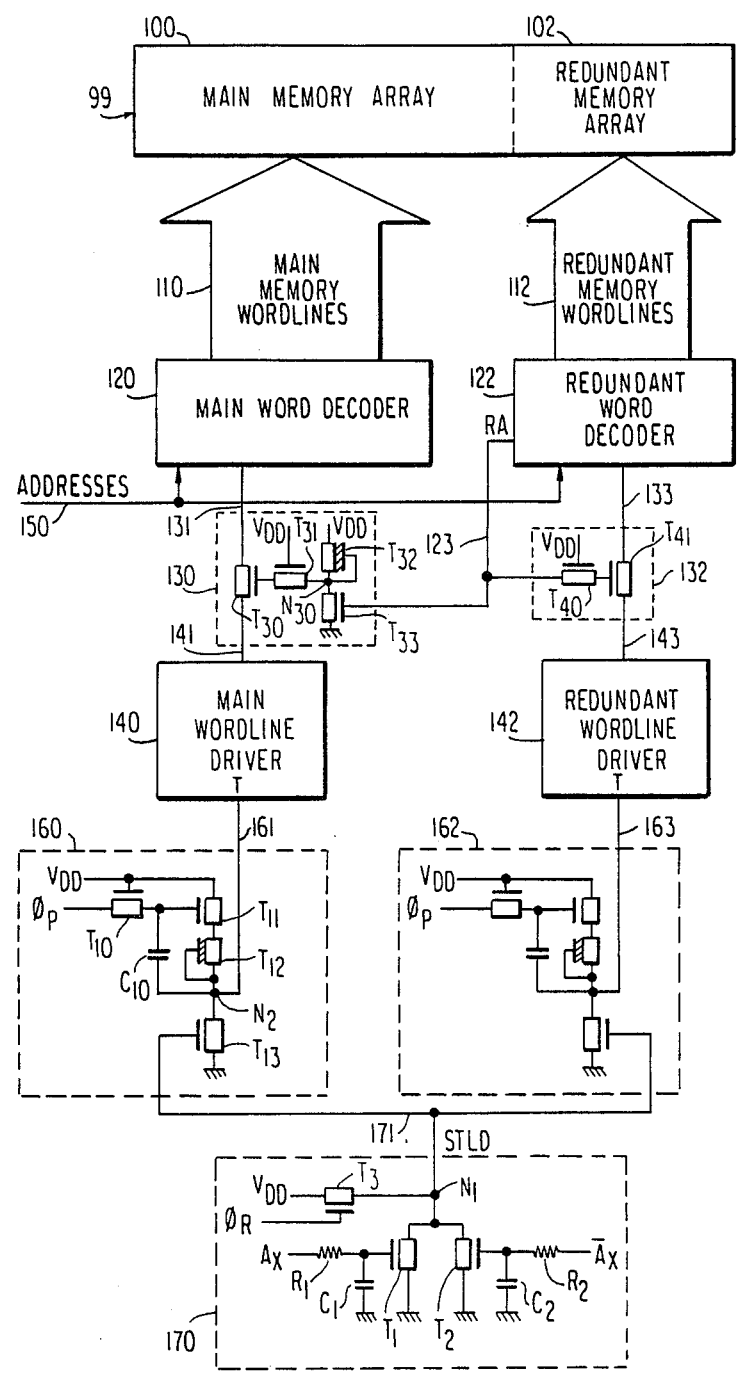

The individual memory cells are typically arranged in symmetrical rows and columns, with each specific memory cell being accessible using an associated wordline. The wordlines in FIG. 1A are generically represented by broadened arrows and are shown divided into two groups, i.e., main memory wordlines 110 and redundant memory wordlines 112. The main memory wordlines 110 emanate from the main word decoder 120, while the redundant memory wordlines 112 emanate from the redundant word decoder 122. Main word decoder 120 and redundant word decoder 122 receive address inputs along an address line 150, and receive wordline driver signals along lines 131 and 133, respectively.

The word decoders can be likened to a railroad switching operation, i.e., the word decoder processes and utilizes incoming address signals to appropriately direct an incoming wordline driver signal to a specific wordline associated with the address. The wordline driver signals for the main word decoder 120 and redundant word decoder 122 originally emanate from the main wordline driver 140 and the redundant wordline driver 142, respectively.

In the desired operation of the memory device of FIG. 1A, address signals are first supplied along a line 150. The main word decoder 120 and the redundant word decoder 122 receive and process these address signals to perform a switching operation. A wordline driver signal is directed by the switching operation of the word decoder to select the appropriate wordline with which the memory cell (to be accessed) is associated.

In practice, a timing constraint is imposed on the operation of the memory device with regard to the wordline driver signal. This timing constraint arises because every word decoder has an inherent and unavoidable delay time before its switching operation can be guaranteed as having been "settled" or performed after receiving an address signal. The worst case settling time for this switching operation is represented generically as "DST" (Decoder Settling Time) in FIG. 1B. Thus, if address signals arrive at the word decoder at a time t=0, DST represents the time at which the switching operation of the word decoder can be guaranteed as having been settled.

In order to synchronize and produce a signal which exactly corresponds to the actual settling time of the main word decoder, the redundancy approach further contains a settling circuit 170 having circuit characteristics which exactly match the characteristics of the basic main word decoder circuit.

The settling circuit is constructed to output a STLD (SETTLED) signal as follows: Prior to a memory operation, the node $N_1$ is precharged to $V_{DD}$ using the FET transistor $T_3$ and a signal $\phi_R$. In order to guarantee the production of a high-to-low STLD signal which is necessary to trigger the operation of the inverter/buffer circuits described below, the addressing groups $A_X$, $R_1$, $C_1$ or $\overline{A}_X$, $R_2$, $C_2$ are arranged to activate one of the FET transistors $T_1$ or $T_2$ for every memory cycle to ground the node. As a result, the settling circuit is dedicated to its signal producing function, and, for every memory cycle, the circuit outputs a high-to-low signal STLD (Settled) at a time exactly corresponding to the time DST as shown in FIG. 1C.

The signal STLD is supplied along a line 171 to the respective inputs of buffer/inverter circuits 160 and 162. In response to the arrival of a STLD signal at its input, each respective buffer/inverter circuit 160, 162 produces and outputs an ENABLE signal as follows: During the application of the high logical portions of the STLD signal as received along line 171, the FET transistor $T_{13}$ is turned on to effectively connect and lock the node $N_2$ to a low logical ground level. Upon the high-to-low transition of the STLD signal which preferably occurs at a time which follows the application of a signal $\phi_P$ the transistor $T_{13}$ is turned off, and the arrangement of the FET transistors $T_{10}$–$T_{12}$ and the capacitor $C_{10}$ is such that node $N_2$ is quickly charged to $V_{dd}$. As a result, the buffer/inverter outputs a low-to-high transition ENABLE signal (FIG. 1D).

The ENABLE signal from the buffer/inverter 160 is applied via line 161 to the trigger input of the main wordline driver 140, and the ENABLE signal from the buffer/inverter 162 is applied via line 163 to the trigger input of the redundant wordline driver 142. In response to the ENABLE signal, the main wordline driver 140 and the redundant wordline driver 142 each produce and output a wordline driver signal WDS (FIG. 1E) along lines 141 and 143, respectively.

In viewing FIGS. 1C and 1D, it should be noted that the ENABLE signal is not produced until a time shortly after the transition of the STLD signal. This "Buffer-/Inverter Delay" time $T_{BD}$ is the inherent and unavoidable delay which occurs before the buffer/inverter gate can perform and output the result of its operation.

At some point during manufacturing of the memory component, the main memory array 100 is tested for defects. Each defective portion (defined along a respective main memory wordline) of the main memory array, is "replaced" by a good portion (defined along a respective redundant memory wordline) of the redundant array 102. To accomplish this, the address of each defective main memory wordline is programmed into a redundant word decoder (using laser-blown fuses, electrically blown fuses, etc.) to become associated with a unique substitute wordline in the redundant array. The redundant word decoder compares incoming address signals with the programmed defective addresses and if a match is found to occur, the redundant Word decoder performs its switching operation to select the appropriate redundant wordline as a substitute.

By using redundancy and by programming the redundant word decoder 122 with the addresses of defective main memory wordlines, a second constraint is imposed on the memory device. When an incoming address is a defective address, the main word decoder 120 and the redundant word decoder 122 simultaneously operate to select both a main memory wordline 110 and a redundant memory wordline 112 using the same address. As mentioned previously, the memory wordlines of the memory structure 99 are connected to further support circuitries (not shown) which sense, amplify and output memory values stored in individual memory cells (not shown). More particularly, both the main memory array 100 and the redundant memory array 102 are connected to and share, these additional support circuitries. As such, special provisions must be made such that only one of the main memory array 100 and the redundant memory array 102 is activated at a particular time, i.e., if wordlines from both the main memory array 100 and the redundant memory array 102 were activated at the same time, the additional support circuitries would receive the outputs from two different memory locations, thus leading to ambiguous results, short circuits, etc. The memory device of FIG. 1A avoids wordline conflicts by utilizing a further circuit arrangement.

The redundant word decoder 122 is constructed to compare an incoming address with the defective addresses programmed into the redundant word decoder, and to output a signal RA (Redundant Address) which is indicative of whether or not the incoming address represents a defective main wordline address. This redundancy signal (FIG. 1F) can typically be output as a low logical voltage when the redundant word decoder 122 has received a good address, and as a high logical voltage when the redundant word decoder 122 has received a defective address. It should be further noted that the state of the semiconductor art is such that the redundant word decoder 122 can be constructed to output the signal RA at a time sooner than, or at a time contemporaneous with, the output of the signal STLD from the main word decoder. Thus, the signal RA can be output at a time $t=s$ (see FIG. 1F) which is contemporaneous with the output of the signal STLD, or the signal RA can be output at exemplary times $t=q$ and $t=r$ which are sooner than the output of the signal STLD.

To utilize the signal RA to avoid memory wordline conflicts, a first logical gate 130 is disposed between the main word decoder 120 and the main wordline driver 140, and a second logical gate 132 is disposed between the redundant word decoder 122 and the redundant wordline driver 142.

The first logical gate 130 has a first input corresponding to the output line 141 of the main wordline driver 140, and a gate input corresponding to the output line 123 from the redundant word decoder 122. The second logical gate 132 has a first input, corresponding to the output line 143 of the redundant wordline driver 142, and a gate input corresponding to the output line 123 from the redundant word decoder 122. The output line 131 of the first logical gate 130, and the output line 133 of the second logical gate 132, are connected to the main word decoder 120 and the redundant word decoder 122, respectively. The operation of this portion of the memory device is as follows:

After comparing an incoming address with the programmed defective wordline addresses, the redundant word decoder 122 outputs the signal RA which is indicative of whether or not the incoming address represents a defective wordline address. This signal propagates along line 123 to the inputs of the first and second logical gates 130 and 132. Since the first logical gate 130 is constructed to respond to a low logical signal and the second logical gate 132 is constructed to respond to a high logical signal, i.e., the first and second logical gates are constructed to respond to opposite logical states, only one of the first and second logical gates 130 and 132 is selected "on" for a given signal RA.

Upon the arrival of the ENABLE signal at the trigger inputs, both the main wordline driver 140 and the redundant wordline driver 142 fire or trigger or produce a driver signal; however, as only one of the first and second logical gates 130 and 132 is selected "on" at a given time, only one of the driver signals is allowed to reach the main memory array 100 or the redundant memory array 102 through the main word decoder 120 or the redundant word decoder 122, respectively. Thus, it can be seen that the only one wordline will be selected in the memory structure 99, and thus the memory device of FIG. 1A avoids wordline conflicts.

The preferred constructions of the logical gates 130 and 132 will be described with reference to FIG. 1A. Transistors $T_{32}$ and $T_{33}$ are connected in an inverter configuration. Signal RA along line 123 is applied to the gate of transistor $T_{33}$, and as a result of the inverter configuration, a signal which is the complement of signal RA appears at a node $N_{30}$. The node $N_{30}$ is connected to the gate of a transistor $T_{30}$ through a transistor $T_{31}$ having a gate connected to $V_{DD}$. Transistor $T_{30}$, so connected, acts as a gating transistor which inhibits or allows the propagation of the driver signal from input line 141 to output line 131, in an inverse relation to the signal RA. More particularly, the memory device is constructed such that the transistor $T_{30}$ normally allows the driver signal to pass, i.e., during times when the signal RA along the line 123 is of a low logical value.

In contrast to the first logical gate 130, the second logical gate 132 has the signal RA directly applied to gating transistor $T_{41}$ through a transistor $T_{40}$. Transistor $T_{40}$ has a gate terminal connected to $V_{DD}$. Transistor $T_{41}$ as connected, acts as a gating transistor which inhibits or allows the propagation of the driver signal from input line 143 to output line 133 in a direct relation to the signal RA. More particularly, the memory device is constructed such that the transistor $T_{41}$ normally inhibits the propagation of the redundant driver signal i.e., driving times when the signal RA along the line 123 is of a low logical value.

As a result of the foregoing, it can be seen that the first and second logical gates 130 and 132 respond to opposite logical values of the signal RA.

The memory device of FIG. 1A is disadvantageous in terms of an access time penalty. At the point in time when the redundant word decoder 122 is outputting the signal RA (FIG. 1F) and the main or redundant wordline driver 140 or 142 is outputting the driver signal WDS (FIG. 1D), both inputs to one of the first or second logical gates 130, 132 will be at the correct logical values to activate one of the logical gates. Thus, at this time (t=u), one of the first and second gates 130 or 132 will be turned on to allow the driver signal to propagate through to the word decoder. However, every semiconductor logical gate suffers from an inherent delay time which unavoidably occurs before the logical gate performs its logical operation and the output terminal reflects the result of that operation. Thus, a delayed word driver signal DWDS is shown in FIG. 1G to have been delayed by a time $T_{GD}$ to emerge from the logical gate at a time t=x. This gate delay $T_{GD}$, however small, effectively increases the access time for the memory device. In this age of advanced and super fast semiconductor memories, memory access time is critical; therefore, it is desirable to eliminate all unnecessary access time penalties.

Figure 2A:
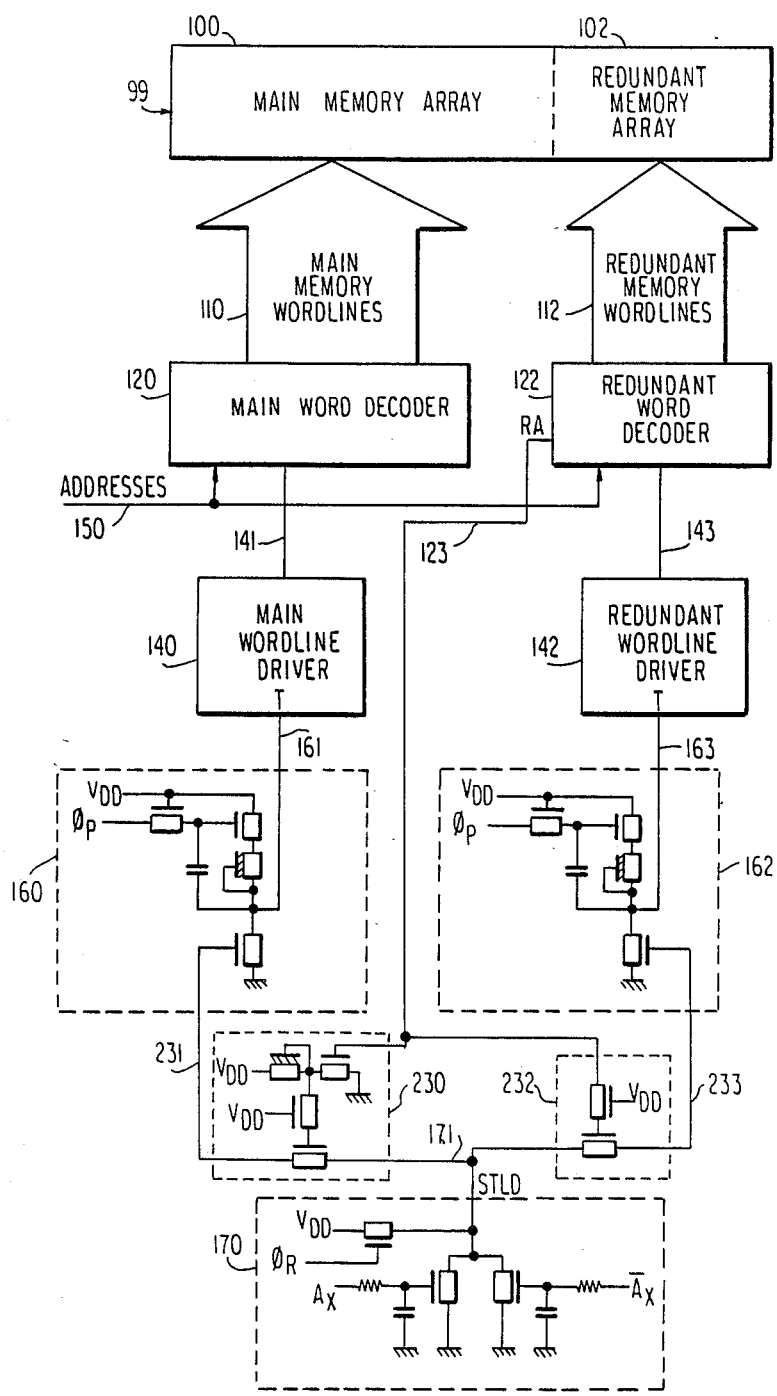

FIG. 2A is another, but still disadvantageous variation of the memory device of FIG. 1A. Logical gates 230, 232 are now disposed to control the propagation of the STLD signal from the settled circuit 170 to the wordline drivers 140, 142, respectively. More particularly, both logical gates 230, 232 have a first input connected to receive the signal STLD from the line 171, and gate inputs connected to receive the signal RA from the line 123. As the construction and operation of the logical gates 230, 232 is the same as the logical gates 130, 132, respectively, detailed discussion thereof is omitted. The output of the logical gates 230 and 232 are connected to the buffer/inverter circuits 160 162, respectively. The operation of the memory device of FIG. 2A will now be described.

After receiving an incoming address signal at a time t=0 (FIG. 2B), the switching operation of the main word decoder 120 becomes settled at a time DST (Decoder Settling Time) and the settling circuit 170 outputs a signal STLD (FIG. 2C). Redundant word decoder 122 also receives the incoming address signal, and after becoming settled and comparing the incoming address to the programmed defective addresses, the redundant word decoder 122 outputs (FIG. 2F) a signal RA (Redundant Address).

As can be seen in FIGS. 2C and 2F, at a time t=s, both of the signals STLD and RA will be available at the inputs of the logical gates 230, 232. Since the first logical gate 130 is constructed to respond to a low logical signal and the second logical gate 132 is constructed to respond to a high logical signal, only one of the logical gates 130 and 132 is selected "on" for a given signal RA. As a result, the memory device of FIG. 2A avoids wordline conflicts as only one of the wordline drivers 140, 142 will be caused to fire or trigger a wordline driver signal at any given time.

The memory device of FIG. 2A suffers from a disadvantage similar to that of the memory device of FIG. 1A. Because of the inherent gate delay $T_{GD}$ of the semiconductor logical gates 230, 232, a D-STLD (Delayed-SETTLED) signal (FIG. 2D) is not output from the activated logical gate 230 or 232 until a time t=w. Once the D-STLD signal arrives at the input of the buffer/inverter 160 or 162, the additional buffer delay $T_{BD}$ (which was discussed previously) is also experienced. As a result, a delayed ENABLE signal D-ENABLE (FIG. 2E) is not output from the buffer/inverter until a time t=x, and hence a Delayed Wordline Driver Signal DWDS (FIG. 2G) does not emerge from the main wordline driver 140 or the redundant wordline driver 142 until a time t=x. Again, the gate delay $T_{GD}$, however small, effectively increases the access time for the memory device. In this age of advanced and super fast semiconductor memories, memory access time is critical; therefore, to optimize the access time of a semiconductor memory product, it is desirable to eliminate all unnecessary access time penalties.

Figure 3A:
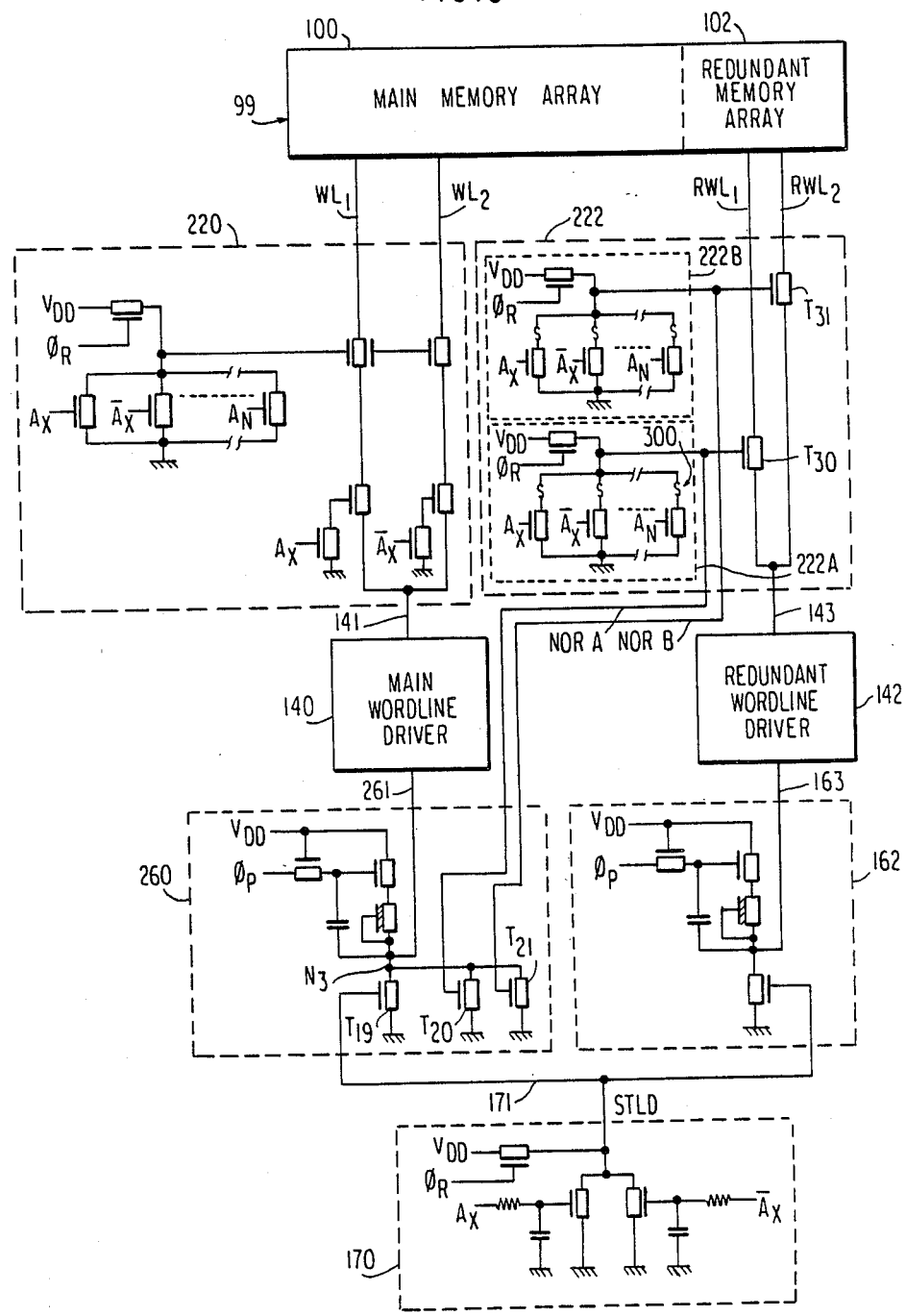

FIG. 3A illustrates a preferred memory device having a unique redundancy arrangement which effectively provides redundancy without the previously discussed logical gate delay $T_{GD}$.

In FIG. 3A, circuit components which are constructed identically to previously-discussed circuit components are assigned identical reference numerals and are not further discussed. The circuitry of the main word decoder 220 and the redundant word decoder 222 are now shown in greater detail; however, as the operation of these circuits are easily understood by those skilled in the art, detailed discussions will not be made. Furthermore, for the sake of clarity and ease of discussion, the main word decoder 220 and the redundant word decoder 222 have been illustrated with only two wordlines $WL_1$, $WL_2$ and two redundant wordlines $RWL_1$, $RWL_2$, respectively; it is to be understood, however, that the teachings of the present invention could easily be expanded to a great number of regular and redundant wordlines.

The inverter/buffer 162 for the redundancy portion of the circuit is the same as the inverter/buffers previously discussed. However, the buffer circuit for the main memory portion of the circuit has been modified to a NOR/buffer 260 which is constructed and operates as follows:

FET transistors $T_{20}$ and $T_{21}$ have been added and are connected to the node $N_3$. The logical voltage of the node $N_3$ is controlled in a similar manner to node $N_2$ which was discussed previously; however, now the additional transistors and $T_{20}$ and $T_{21}$ can also be activated to lock the node $N_3$ to logical ground. The activation of the transistor $T_{20}$ is controlled by a signal NOR A from a first redundancy decoder group 222A, and the activation of the transistor $T_{21}$ is controlled by a signal NOR B from a second redundancy decoder group 222B.

As a result of the foregoing arrangement, the operation of the main memory portion of the redundancy approach is as follows: The main word decoder 220 becomes settled (FIG. 3B) and the settling circuit 170 outputs the STLD signal (FIG. 3C) at a time DST. Simultaneously, the first and second redundancy decoder groups 222A, 222B receive and make a determination as to whether the incoming address signal represents a bad address. More particularly, after comparing the incoming address signal to the bad address programmed into fusible links 300, the first redundancy decoder group 222A is constructed to output, to the transistor $T_{20}$, a signal NOR A which is indicative of this comparison. If the incoming address matches the bad address programmed into the first redundancy group, the firing, triggering or selecting of the main wordline driver 140 is inhibited as the NOR A signal (FIG. 3D) would remain at a high logical voltage after a time DST and the NOR/buffer 260 would be locked to output a low logical voltage. Similar discussions can be made with regard to the operation of the second redundancy decoder group 222B in conjunction with the transistor $T_{21}$.

While the above-discussed, NOR/buffer 260 arrangement inhibits the firing, triggering or selecting of the main wordline driver to prevent a wordline conflict during times when there is a bad address, the NOR/buffer does nothing to prevent wordline conflicts during times when there is a good address. This feature is provided by another portion of the redundancy approach.

In addition to being connected to the transistor $T_{20}$, the NOR A signal of the first redundancy decoder group is also connected to a transistor $T_{30}$ which controls the propagation of the redundant wordline driver signal along the redundant wordline $RWL_1$. Similarly, in addition to being connected to the transistor $T_{21}$, the NOR B signal of the second redundancy group is also connected to a transistor $T_{31}$ which controls the propagation of the redundant wordline driver signal along the redundant wordline $RWL_2$. This arrangement effectively prevents wordline conflicts during times when there is a good address, as follows:

The settling circuit outputs a high-to-low transition STLD signal (FIG. 3C) for every memory cycle, and hence, the directly connected buffer/inverter 162 also enables the redundant wordline driver 142 to fire for every memory cycle. The fired or triggered redundant wordline driver signal is output on line 143 and attempts to propagate along the redundant wordlines $RWL_1$ and $RWL_2$. If the incoming address signal does not match the respective bad addresses programmed into either of the first and second redundancy groups, the NOR A and NOR B signals will become low at a time DST to effectively turn off the transistors $T_{30}$, $T_{31}$ which blocks the propagation of the redundant wordline driver signal. Thus, for good incoming address signals, the redundancy approach of FIG. 3A avoids wordline conflicts. In contrast, if an incoming address signal matches a respective bad address programmed into either of the first or second redundancy decoder groups 222A, 222B, the NOR A or NOR B signal will be high after a time DST to allow the propagation of the redundant wordline driver signal, and inhibit the firing, triggering or selecting of the main wordline driver.

The advantage of the memory device of FIG. 3A over the memory devices of FIGS. 1A and 2A, can be seen by analyzing the timing diagrams of the memory device of FIG. 3A. The signal STLD (FIG. 3C) is output at a time DST, and the first and second redundancy decoder groups are constructed to also output the signals NOR A and NOR B at the time DST. As the NOR function of the transistors $T_{20}$ and $T_{21}$ of the NOR/buffer 260 operate contemporaneously and in parallel with the transistor $T_{19}$, the additional logical gate delay $T_{GD}$ is avoided. As a result, the wordline driver signal WDS (FIG. 3G) is only delayed by the unavoidable buffer delay $T_{BD}$ and is output at a time $t=u$.

Thus, there has been described a novel wordline redundancy scheme in which the number of timing signals transitions and the time necessary to deselect the normal wordline select circuitry are minimized, thereby reducing the redundancy select time such that it can be guaranteed to occur within the time normally required for worse case wordline selection. The technique is implemented by controlling the application of driver signals from either a main wordline driver or the redundant wordline driver by using NOR signals from a redundant word decoder, which are indicative of whether or not an incoming address is a bad address. Accordingly, there can be constructed an advantageous memory device implementing redundancy and having a simplified timing arrangement and without an access time penalty.

While the invention has been particularly shown and described with reference to the preferred embodiment thereof, it will be understood by those skilled in the art that various changes in the form and details of the device and method may be made therein without departing from the spirit and scope of the invention.

What is claimed is:

1. A semiconductor memory device comprising:
main wordline driver means for producing a main driver signal to be applied to a main wordline in a main memory array;

redundant wordline driver means for producing a redundant driver signal to be applied to a redundant wordline in a redundant memory array;

redundant word decoder means, associated with at least one redundant wordline, for comparing an input address signal with defective main memory wordline addresses and, in response to the comparison, producing at least one comparison signal to control the propagation of said redundant driver signal along said at least one redundant wordline; and main trigger means receiving said at least one comparison signal and, in response thereto, controlling a triggering of said main wordline driver means to produce said main driver signal;

wherein said main trigger means and said redundant word decoder means are responsive to opposite states of said at least one comparison signal, such that, for a given comparison signal, only one of said main driver signal and redundant driver signal is allowed to propagate to said main and redundant memory array.

2. A semiconductor memory device comprising:

main wordline driver means for producing a main driver signal to be applied to a main wordline in a main memory array;

redundant wordline driver means for producing a redundant driver signal to be applied to a redundant wordline in a redundant memory array;

redundant word decoder means, associated with at least one redundant wordline, for comparing an input address signal with defective main memory wordline addresses and, in response to the comparison, producing at least one comparison signal to control the propagation of said redundant driver signal along said at least one redundant wordline;

main trigger means receiving said at least one comparison signal and, in response thereto, controlling a triggering of said main wordline driver means to produce said main driver signal;

main word decoder means for performing a switching operation, in response to said input address signal, for directing the propagation of said main driver signal to said main wordline in said main memory array;

redundant trigger means for controlling the triggering of said redundant wordline driver means to produce said redundant driver signal; and settling signal means for producing a settling signal to be applied to said main and redundant trigger means for controlling the triggering of said main and redundant wordline driver means, wherein said settling signal means has a construction and operation which are substantially similar to a decoder circuit of said main word decoder means such that said settling signal is not output until a time when said switching operation of said main word decoder means can be guaranteed as being settled; and wherein said main trigger means and said redundant word decoder means are responsive to opposite states of said at least one comparison signal, such that, for a given comparison signal, only one of said main driver signal and redundant driver signal is allowed to propagate to said main and redundant memory array.

3. A semiconductor memory device as claimed in claim 2, wherein:

said redundant trigger means comprises redundant charging means, the output of which controls the triggering of said redundant wordline driver means, the operation of said redundant charging means being controlled by a redundant grounding means which receives and is controlled by said settling signal; and said main trigger means comprises main charging means, the output of which controls the triggering of said main wordline driver means, the operation of said main charging means being controlled by a plurality of respective grounding means, each of which receives and is controlled by a different one of said settling signal and said at least one comparison signal.

4. A semiconductor memory device as claimed in claim 3, wherein:

said at least one comparison signal is not output until a time when said switching operation of said main word decoder means can be guaranteed as being settled.

5. A semiconductor memory device as claimed in claim 4, wherein:

said redundant word decoder means performs a switching operation to allow the propagation of said redundant driver signal to a redundant wordline when said input address signal corresponds to a defective address.

6. A semiconductor memory device as claimed in claim 5, wherein said redundant word decoder means is programmable with defective addresses.

7. A semiconductor memory device as claimed in claim 6, wherein said comparison signal can be output as one of a first and second state, said first state being indicative of a match between the input address signal and a defective address, said second state being indicative of a non-match between the input address signal and a defective address.

8. A semiconductor memory device comprising:

main wordline driver means for producing a main driver signal to be applied to a main wordline in a main memory array;

redundant wordline driver means for producing a redundant driver signal to be applied to a redundant wordline in a redundant memory array;

redundant word decoder means, associated with at least one redundant wordline, for comparing an input address signal with defective main memory wordline addresses and, in response thereto, producing at least one comparison signal to control the propagation of said redundant driver signal along said at least one redundant wordline;

main word decoder means for performing a switching operation, in response to said input address signal, for directing the propagation of said main driver signal to said main wordline in said main memory array;

main trigger means for receiving said at least one comparison signal and, in response thereto, controlling a triggering of said main wordline driver means to produce said driver signal;

redundant trigger means for controlling the triggering of said redundant wordline driver means to produce said redundant driver signal; and settling signal means for producing a settling signal to be applied to said main and redundant trigger means for controlling the triggering of said main and redundant wordline driver means, wherein said settling signal is not output until a time when said switching operation of said main word decoder means can be guaranteed as being settled; and wherein said main trigger means and said redundant word decoder means are responsive to opposite states of said at least one comparison signal, such that only one of said main driver signal and redundant driver signal is allowed to propagate to said main and redundant memory array for a given comparison signal.

9. A semiconductor memory device as claimed in claim 8, wherein:

said redundant trigger means comprises redundant charging means, the output of which controls the triggering of said redundant wordline driver means, the operation of said redundant charging means being controlled by a redundant grounding means which receives and is controlled by said settling signal; and said main trigger means comprises main charging means, the output of which controls the triggering of said main wordline driver means, the operation of said main charging means being controlled by a plurality of respective grounding means, each of which receives and is controlled by a different one of said settling signal and said at least one comparison signal.

10. A semiconductor memory device as claimed in claim 9, wherein said at least one comparison signal is not output until a time when said switching operation of said main word decoder means can be guaranteed as being settled.

11. A semiconductor memory device as claimed in claim 10, wherein:

said redundant word decoder means performs a switching operation to allow the propagation of said redundant driver signal to a redundant wordline when said input address signal corresponds to a defective address.

12. A semiconductor memory device as claimed in claim 11, wherein said redundant word decoder means is programmable with defective addresses.

13. A semiconductor device as claimed in claim 12, wherein said comparison signal can be output as one of a first and second state, said first state being indicative of a match between the input address signal and a defective address, said second state being indicative of a non-match between the input address signal and a defective address.

14. A method for providing wordline redundancy in a semiconductor memory device, said method comprising the steps of:

producing a main driver signal to be applied to a main wordline in a main memory array;

producing a redundant driver signal to be applied to a redundant wordline in a redundant memory array;

comparing an input address signal with defective main memory wordline addresses and in response to the comparison, producing at least one comparison signal to control the propagation of a redundant driver signal along at least one redundant wordline; and receiving said at least one comparison signal and in response thereto, controlling a triggering of a main wordline driver means to produce a driver signal; and wherein the controlling operation of said comparing step and the controlling operation of said receiving step are responsive to opposite states of said at least one comparison signal, such that, for a given comparison signal, only one of said main driver signal and redundant driver signal is allowed to be applied to a memory array.

15. A method for providing wordline redundancy in a semiconductor memory device, said method comprising the steps of:

producing a main driver signal to be applied to a main wordline in a main memory array;

producing a redundant driver signal to be applied to a redundant wordline in a redundant memory array;

comparing an input address signal with defective main memory wordline addresses and in response to the comparison, producing at least one comparison signal to control the propagation of a redundant driver signal along at least one redundant wordline;

receiving said at least one comparison signal and in response thereto, controlling a triggering of a main wordline driver means to produce a driver signal;

performing a switching operation with a main word decoder means to select a main wordline corresponding to said input address signal; and producing a settling signal for controlling the production of said main and redundant driver signal, wherein said settling signal is not output until a time when a switching operation of said main word decoder means can be guaranteed as being settled; and wherein the controlling operation of said comparing step and the controlling operation of said receiving step are responsive to opposite states of said at least one comparison signal, such that, for a given comparison signal, only one of said main driver signal and redundant driver signal is allowed to be applied to a memory array.

16. A method as claimed in claim 15, comprising the further method step of:

performing a switching operation with a redundant word decoder means to select a redundant wordline when said input address signal corresponds to a defective address.

17. A method as claimed in claim 15, wherein said comparison signal can be output as one of a first and second state, said first state being indicative of a match between the input address signal and a defective address, said second state being indicative of a non-match between the input address signal and a defective address.

* * * * *